US012599923B2

(12) United States Patent
Baek et al.

(10) Patent No.: US 12,599,923 B2
(45) Date of Patent: Apr. 14, 2026

(54) APPARATUS AND METHOD FOR CLEANING FLUID DISCHARGING NOZZLE

(71) Applicant: ZEUS CO., LTD., Hwaseong-si (KR)

(72) Inventors: Seung Dae Baek, Hwaseong-si (KR); Kang Won Kim, Ansan-si (KR); Gun Hyung Kim, Yongin-si (KR); Jae Ho Cheon, Osan-si (KR)

(73) Assignee: ZEUS CO., LTD., Hwaseong-si (KR)

( * ) Notice: Subject to any disclaimer, the term of this patent is extended or adjusted under 35 U.S.C. 154(b) by 540 days.

(21) Appl. No.: 18/089,201

(22) Filed: Dec. 27, 2022

(65) Prior Publication Data

US 2023/0201856 A1 Jun. 29, 2023

(30) Foreign Application Priority Data

Dec. 27, 2021 (KR) ........................ 10-2021-0188758

(51) Int. Cl.
| | |
|---|---|
| *B05B 15/555* | (2018.01) |
| *F26B 21/00* | (2006.01) |
| *F26B 21/14* | (2006.01) |
| *H01L 21/67* | (2006.01) |

(52) U.S. Cl.
CPC .......... *B05B 15/555* (2018.02); *F26B 21/006* (2013.01); *F26B 21/14* (2013.01); *H01L 21/67028* (2013.01); *H01L 21/67051* (2013.01)

(58) Field of Classification Search
CPC ............. B05B 15/555; H01L 21/67051; H01L 21/67028; F26B 21/14; F26B 21/006
See application file for complete search history.

(56) References Cited

U.S. PATENT DOCUMENTS

| | | | | |
|---|---|---|---|---|
| 4,977,911 | A | * | 12/1990 | Vetter ................... B05B 15/555 134/34 |
| 6,210,481 | B1 | * | 4/2001 | Sakai .................... B05B 15/555 118/712 |
| 6,478,035 | B1 | | 11/2002 | Niuya et al. |

(Continued)

FOREIGN PATENT DOCUMENTS

| | | |
|---|---|---|
| CN | 111633531 | 9/2020 |
| JP | 2013-251409 | 12/2013 |

(Continued)

OTHER PUBLICATIONS

Machine Translation of JP 2017092240 A to Kashiwayama et al., May 2017. (Year: 2017).*

(Continued)

*Primary Examiner* — Benjamin L Osterhout
(74) *Attorney, Agent, or Firm* — KILE PARK REED & HOUTTEMAN PLLC

(57) ABSTRACT

A fluid discharging nozzle cleaning apparatus includes: a cup in which an inner space, an upper opening which is open to allow a fluid discharging nozzle to enter the inner space, and a lower opening through which a cleaning liquid is discharged from the inner space to an outside are formed; a cleaning liquid discharger configured to discharge the cleaning liquid to the fluid discharging nozzle in a state in which the fluid discharging nozzle is positioned in the inner space of the cup; and a drying gas discharger configured to discharge a drying gas for drying the fluid discharging nozzle after the discharge of the cleaning liquid ends.

15 Claims, 7 Drawing Sheets

(56) References Cited

U.S. PATENT DOCUMENTS

|  |  |  |  |
|---|---|---|---|
| 9,869,941 B2 | 1/2018 | Uemura et al. | |
| 10,700,166 B2 | 6/2020 | Kai et al. | |
| 2004/0173153 A1* | 9/2004 | Muramatsu | B05B 15/557 |
|  |  |  | 118/715 |
| 2008/0023034 A1* | 1/2008 | Hirao | B05B 15/557 |
|  |  |  | 134/186 |
| 2013/0020284 A1 | 1/2013 | Osada et al. | |
| 2015/0059808 A1 | 3/2015 | Yu et al. | |
| 2018/0061678 A1* | 3/2018 | Miura | H01L 21/6715 |
| 2020/0038897 A1* | 2/2020 | Kamimura | H01L 21/6708 |

FOREIGN PATENT DOCUMENTS

|  |  |  |
|---|---|---|
| JP | 2017-092240 | 5/2017 |
| KR | 10-2005-0097380 | 10/2005 |
| KR | 10-2007-0036865 | 4/2007 |
| KR | 10-2012-0015662 | 2/2012 |
| TW | 202126395 | 7/2021 |

OTHER PUBLICATIONS

Extended European Search Report for European Application No. 22215452.8, dated May 2, 2023.

* cited by examiner

APPARATUS AND METHOD FOR CLEANING FLUID DISCHARGING NOZZLE

CROSS-REFERENCE TO RELATED APPLICATION

This application claims the benefit of priority under 35 USC § 119(a) to Korean Patent Applications No. 10-2021-0188758, filed on Dec. 27, 2021, the entire disclosure of which is incorporated herein by reference for all purposes.

BACKGROUND

Technical Field

The present disclosure relates to an apparatus and method for cleaning a fluid discharging nozzle of a fluid discharging apparatus that discharges a fluid for surface treatment of a substrate.

Discussion of the Background

Generally, a semiconductor process includes an etching process in which a substrate, that is, a wafer, is etched, a singulation process in which the wafer is diced into a plurality of dies, and a cleaning process in which the wafer is cleaned. A substrate treatment apparatus used in the wafer etching process or wafer cleaning process includes a rotary chuck configured to rotatably support the wafer and a fluid discharging apparatus configured to discharge a treatment fluid to the rotating wafer.

The fluid discharging apparatus includes at an end thereof a fluid discharging nozzle from which the treatment fluid is discharged. However, while the treatment fluid is discharged or while the discharge of the treatment fluid is stopped, fume that contaminates a process chamber or the wafer may be released from the fluid discharging nozzle.

Also, the remaining treatment fluid failed to fall onto the wafer may form like water drops on the fluid discharging nozzle, or contaminants scattered from the wafer may be attached to the fluid discharging nozzle. The treatment fluid or contaminants remaining on or attached to the fluid discharging nozzle in this way may be condensed, dried, and hardened, then fall onto the wafer and cause quality failure in the wafer or block an opening of the fluid discharging nozzle and interrupt the discharge of the treatment fluid.

The related art of the present disclosure is disclosed in Korean Unexamined Patent Application Publication No. 10-2005-0097380 (Date of Publication: Oct. 7, 2005, Title of Disclosure: nozzle cleaning apparatus).

SUMMARY

The present disclosure is directed to providing an apparatus and method for cleaning and drying a fluid discharging nozzle of a fluid discharging apparatus, which discharges a treatment fluid to a substrate, so that contaminants are removed from the fluid discharging nozzle.

A fluid discharging nozzle cleaning apparatus according to the present disclosure includes: a cup having an upper opening which is open to allow a fluid discharging nozzle to enter an inner space and a lower opening through which a cleaning liquid is discharged from the inner space to an outside; a cleaning liquid discharger configured to discharge the cleaning liquid to the fluid discharging nozzle in a state in which the fluid discharging nozzle is positioned in the inner space of the cup; and a drying gas discharger configured to discharge a drying gas for drying the fluid discharging nozzle after the discharge of the cleaning liquid ends.

In the present disclosure, the cleaning liquid discharger may discharge the cleaning liquid inward from a sidewall of the cup between the upper opening and the lower opening of the cup, and the drying gas discharger may discharge the drying gas inward from a point on the sidewall of the cup that is higher than a point from which the cleaning liquid is discharged.

In the present disclosure, the cleaning liquid discharger may include: an annular flow path portion configured to surround the cup and be coupled to the cup; a connecting flow path portion configured to protrude in a radial direction from the annular flow path portion and be fluidly connected through an inside thereof to the annular flow path portion; a cleaning liquid supply tube having one side fluidly connected to a cleaning liquid tank and the other side fluidly connected to the connecting flow path portion; and a cleaning liquid supply pump configured to press the cleaning liquid so that the cleaning liquid is discharged from the cleaning liquid tank toward an inside of the cup.

In the present disclosure, the drying gas discharger may be provided as a plurality of drying gas dischargers, and a height of a point toward which a drying gas discharged by the drying gas discharger positioned at a relatively high point among the plurality of drying gas dischargers heads may be higher than a height of a point toward which a drying gas discharged by the drying gas discharger positioned at a relatively low point heads.

In the present disclosure, the drying gas discharger may include: an annular flow path portion which is configured to surround the cup and be coupled to the cup and has an annular flow path, through which the drying gas is able to flow, provided therein; a connecting flow path portion configured to protrude in a radial direction from the annular flow path portion and be fluidly connected to the annular flow path; a drying gas supply tube having one side fluidly connected to a drying gas tank and the other side fluidly connected to the connecting flow path portion; and a drying gas supply pump configured to press the drying gas so that the drying gas is discharged from the drying gas tank toward an inside of the cup.

In the present disclosure, the fluid discharging nozzle may be provided as a plurality of fluid discharging nozzles, the plurality of fluid discharging nozzles may be disposed adjacent to each other and move together in horizontal and vertical directions, the cleaning liquid discharger may simultaneously discharge the cleaning liquid to the plurality of fluid discharging nozzles positioned in the inner space of the cup, and the drying gas discharger may simultaneously discharge the drying gas to the plurality of fluid discharging nozzles after the discharge of the cleaning liquid ends.

In the present disclosure, the cleaning liquid discharger may discharge the cleaning liquid with a flow rate in a range of 0.3 to 3.0 L/min (liter/minute) to the inner space of the cup, and an amount of time during which the cleaning liquid is discharged may be in a range of 10 seconds to 2 minutes.

In the present disclosure, the drying gas discharger may discharge the drying gas with a flow rate in a range of 30 to 100 L/min to the inner space of the cup, and an amount of time during which the drying gas is discharged may be in a range of 30 seconds to 5 minutes.

In the present disclosure, the cleaning liquid may be deionized water, and the drying gas may be a nitrogen gas $(N_2)$.

The fluid discharging nozzle cleaning apparatus according to the present disclosure may further include a gas exhauster configured to, to prevent a gas accumulated in the inner space of the cup from being discharged through the upper opening while the cleaning liquid discharger and the drying gas discharger operate, suction the gas from the inner space of the cup and discharge the suctioned gas to the outside of the cup.

In the present disclosure, the gas exhauster may include: an annular flow path portion configured to surround the cup and be coupled to the cup; a connecting flow path portion configured to protrude in a radial direction from the annular flow path portion and be fluidly connected to the annular flow path portion; and an exhaust tube having one side fluidly connected to an exhaust pump and the other side fluidly connected to the connecting flow path portion.

A method for cleaning a fluid discharging nozzle according to the present disclosure includes: a nozzle positioning operation in which, to allow the fluid discharging nozzle to be positioned in an inner space of a cup, the fluid discharging nozzle is caused to enter the inner space of the cup through an upper opening of the cup; a cleaning liquid discharging operation in which a cleaning liquid is discharged to clean the fluid discharging nozzle; and a drying operation in which, after the cleaning liquid discharging operation ends, a drying gas is is discharged to dry a surface of the fluid discharging nozzle.

In the present disclosure, the cup may be positioned at a point to which the fluid discharging nozzle returns after an end of a task in which the fluid discharging nozzle discharges a fluid to a substrate to treat the substrate, and between a start time point of the nozzle positioning operation and an end time point of the drying operation, the substrate treated with the discharged fluid may be replaced with a substrate to which the fluid has not been discharged.

The method according to the present disclosure may further include, prior to the nozzle positioning operation, a treatment fluid discharging operation in which a treatment fluid is discharged to a substrate through the fluid discharging nozzle to treat the substrate.

The method according to the present disclosure may further include a gas exhausting operation in which, to prevent a gas accumulated in the inner space of the cup from being discharged to an outside of the cup through the upper opening while the cleaning liquid discharging operation and the drying operation are performed, the gas is suctioned from the inner space of the cup and discharged to the outside of the cup.

BRIEF DESCRIPTION OF THE DRAWINGS

The above and other objects, features and advantages of the present disclosure will become more apparent to those of ordinary skill in the art by describing exemplary embodiments thereof in detail with reference to the accompanying drawings, in which.

DETAILED DESCRIPTION OF THE ILLUSTRATED

Hereinafter, an apparatus and method for cleaning a fluid discharging nozzle according to an embodiment of the present disclosure will be described in detail with reference to the accompanying drawings. Terminologies used herein are terminologies used to properly describe exemplary embodiments of the present disclosure and may be changed according to an intention of a user or an operator or practice in the art to which the present disclosure pertains. Therefore, the terminologies used herein should be defined on the basis of the content throughout the specification.

Figure 1:
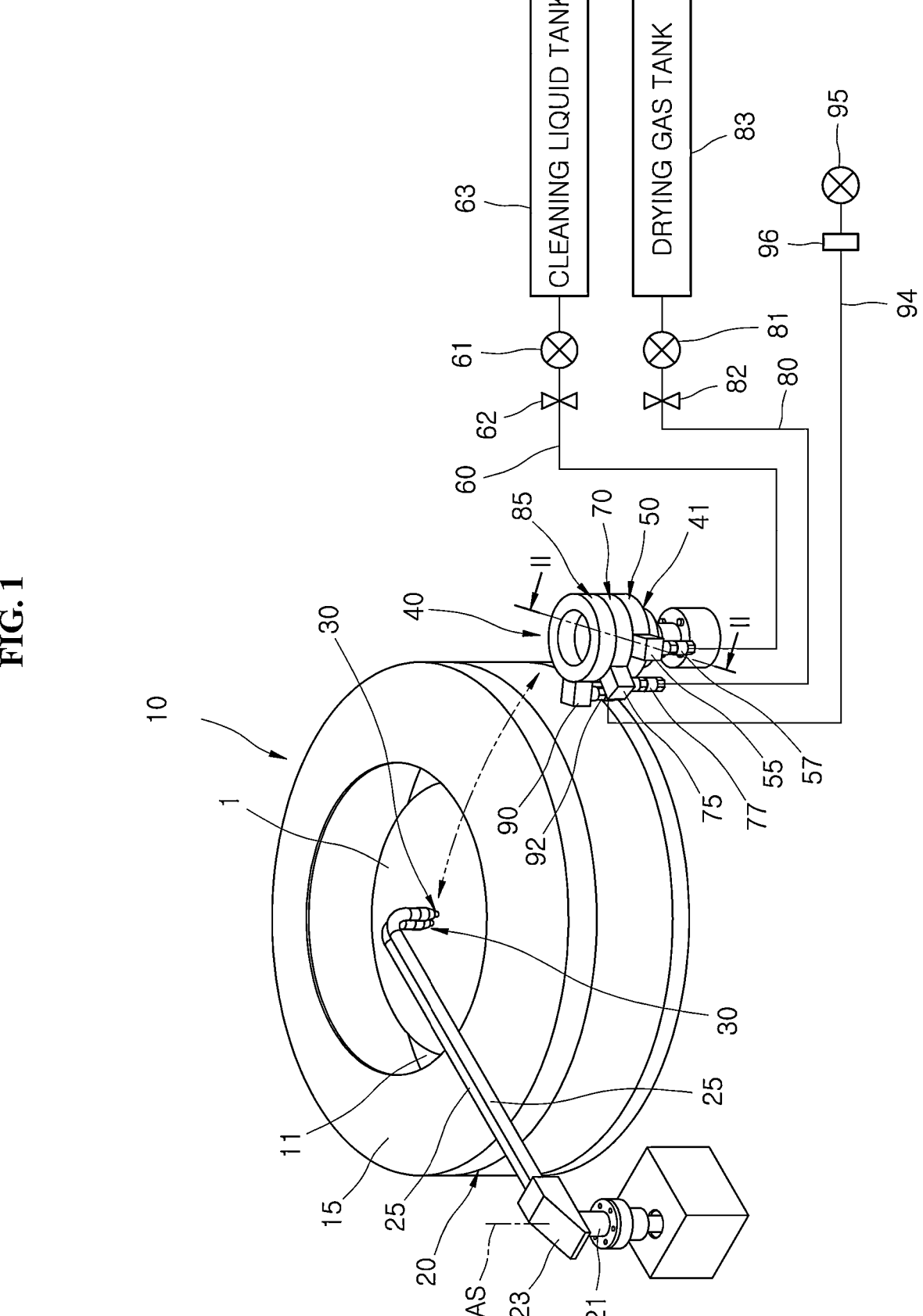
FIG. 1 is a perspective view illustrating a substrate treatment apparatus including a fluid discharging nozzle cleaning apparatus according to a first embodiment of the present disclosure.
Figure 2:
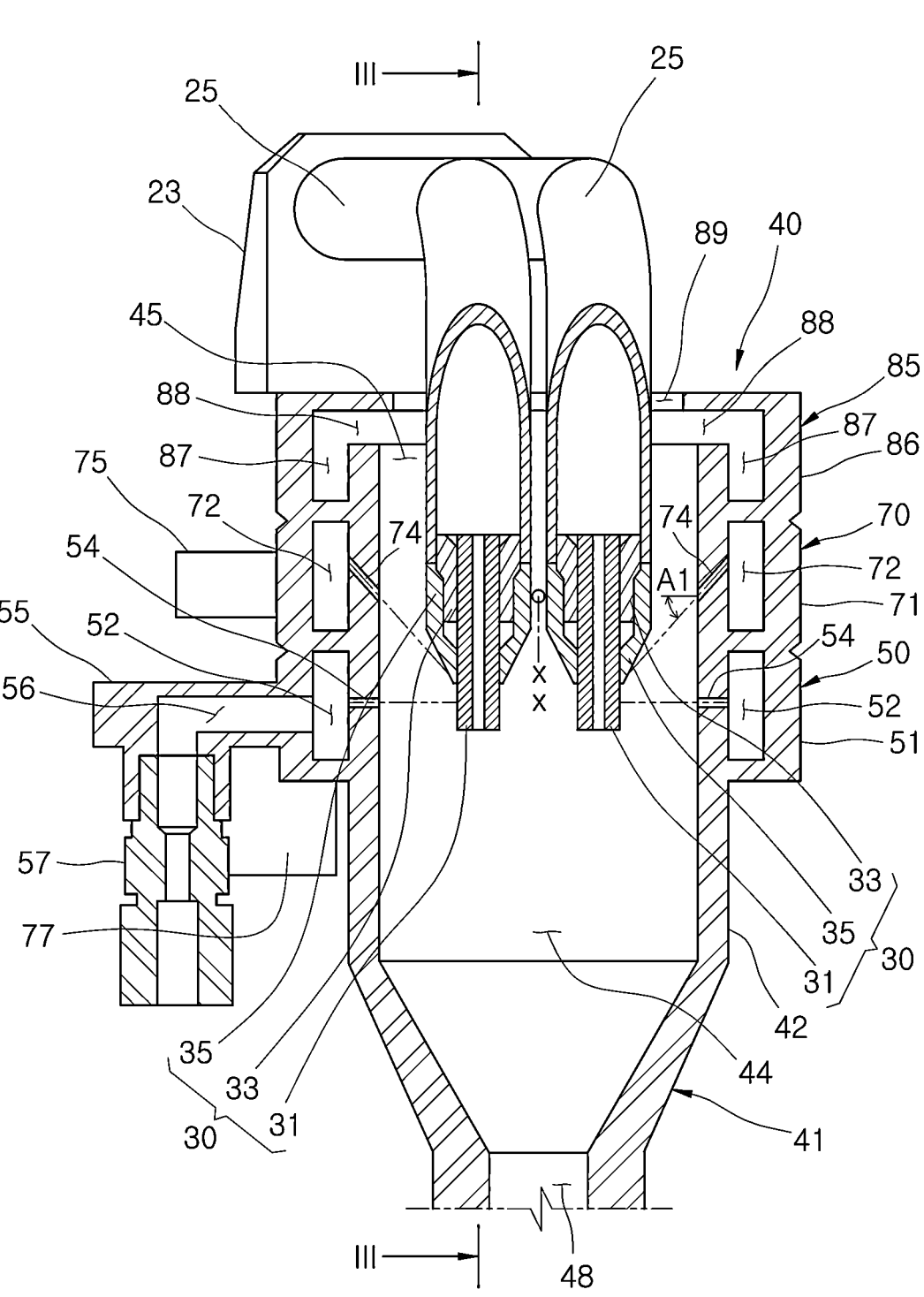
FIG. 2 is a longitudinal cross-sectional view of the fluid discharging nozzle cleaning apparatus of FIG. 1 and illustrates a state in which a fluid discharging nozzle is inserted into a cup.
Figure 3:
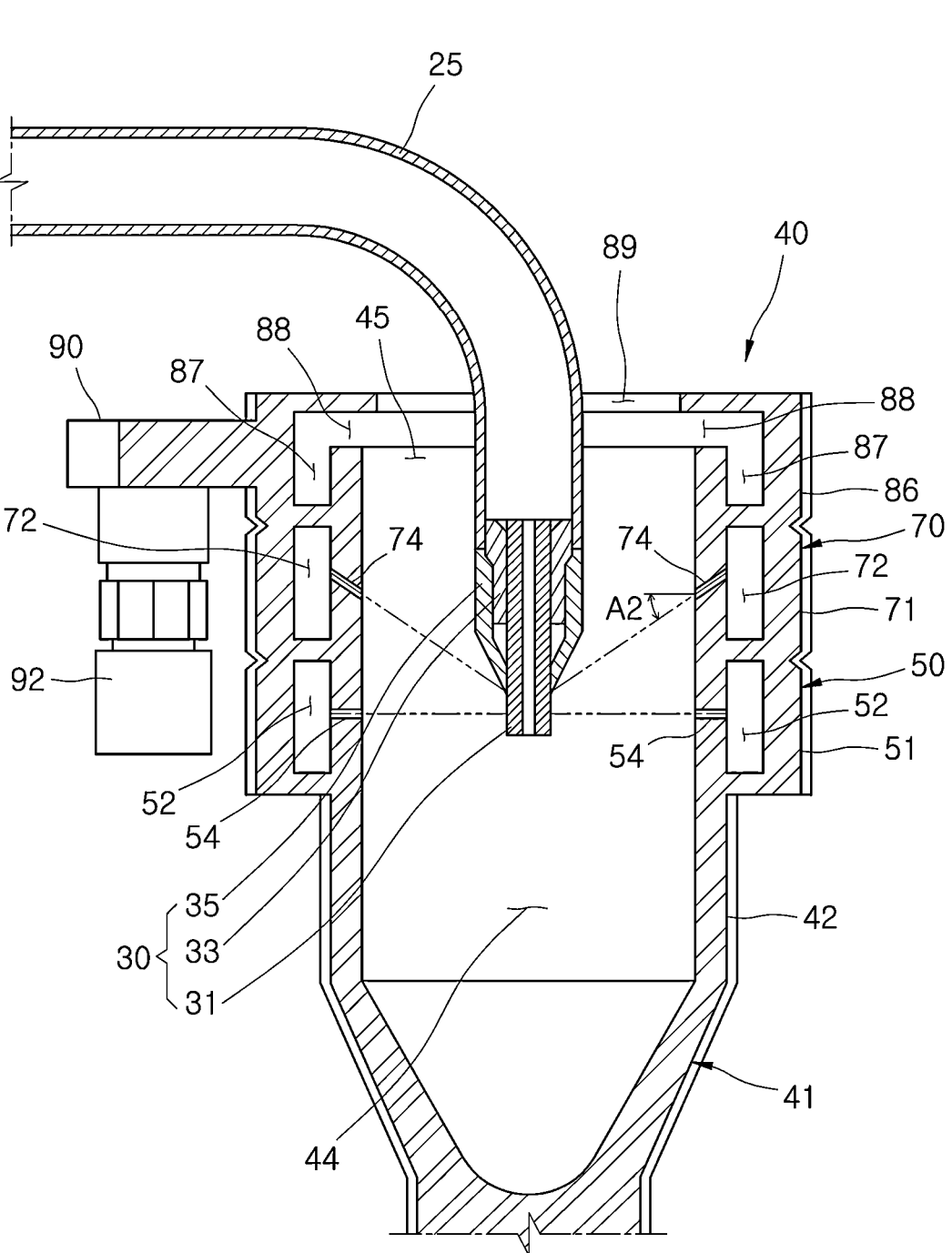
FIG. 3 is a longitudinal cross-sectional view taken along line of FIG. 2.
Figure 4:
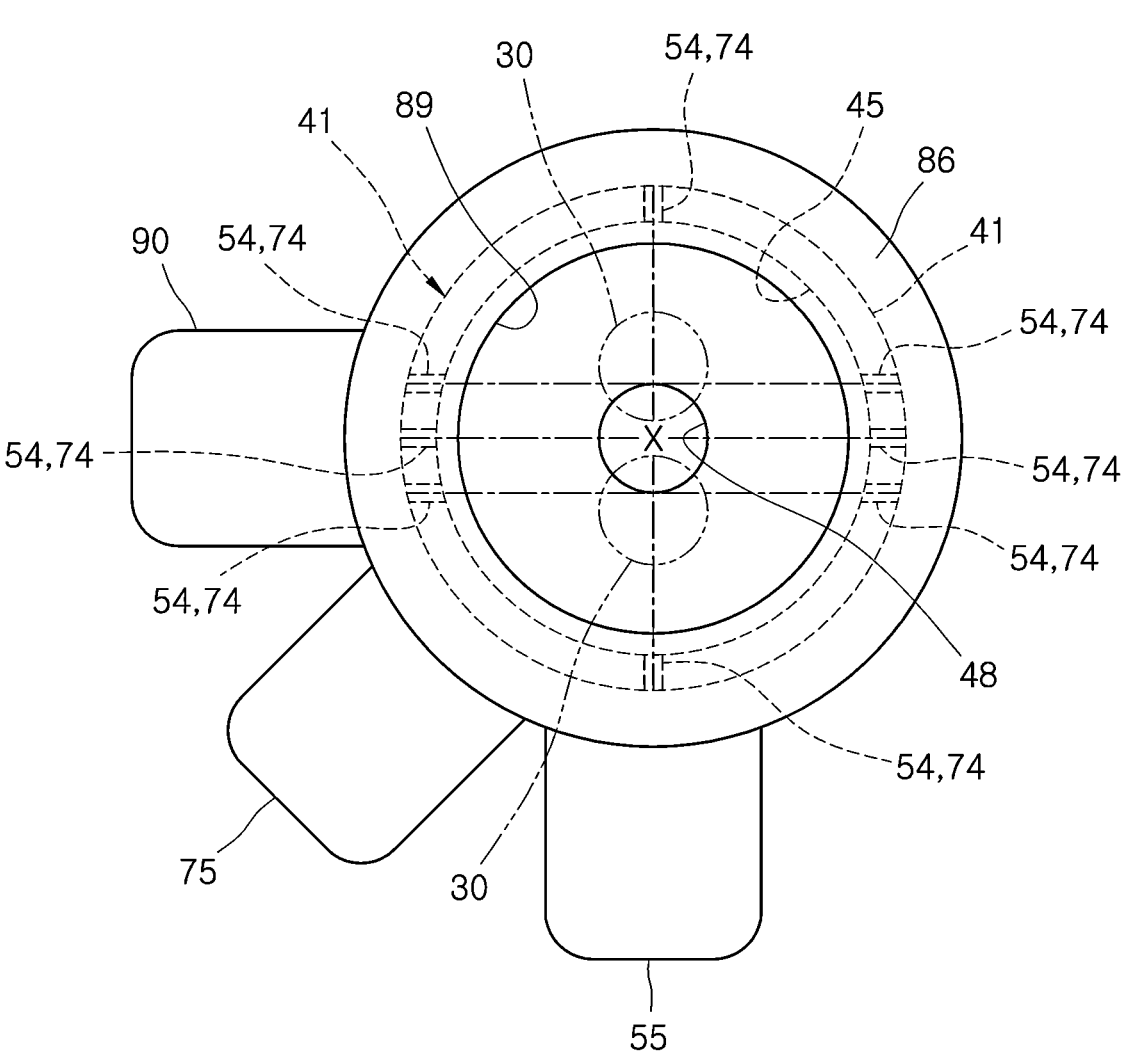
FIG. 4 is a plan view of the cup of the fluid discharging nozzle cleaning apparatus of FIG. 2.

FIG. 1 is a perspective view illustrating a substrate treatment apparatus including a fluid discharging nozzle cleaning apparatus according to a first embodiment of the present disclosure, FIG. 2 is a longitudinal cross-sectional view of the fluid discharging nozzle cleaning apparatus of FIG. 1 and illustrates a state in which a fluid discharging nozzle is inserted into a cup, FIG. 3 is a longitudinal cross-sectional view taken along line of FIG. 2, and FIG. 4 is a plan view of the cup of the fluid discharging nozzle cleaning apparatus of FIG. 2.

Referring to FIGS. 1 to 4, a fluid discharging nozzle cleaning apparatus 40 according to the first embodiment of the present disclosure is provided in a substrate treatment apparatus 10 that discharges a treatment fluid to an upper surface of a substrate 1 to treat the substrate 1.

The substrate 1 illustrated in FIG. 1 is a wafer used in manufacturing semiconductor chips, but a substrate to be treated according to the present disclosure is not limited to the wafer and may be other substrates such as a flat panel display substrate and a solar panel substrate.

The substrate treatment apparatus 10 includes a table 11, an anti-scatter cover 15, a fluid discharging apparatus 20, and the fluid discharging nozzle cleaning apparatus 40.

The table 11 fixes and supports the substrate 1 and rotates during a process in which a treatment fluid is discharged to treat the substrate 1, such as a process of etching the substrate 1. The table 11 may be a chuck table which includes a chuck for fixing the substrate 1 to fix the substrate 1 and rotates.

The anti-scatter cover 15 surrounds the table 11 and blocks the treatment fluid and contaminants bouncing from the substrate 1 to prevent the treatment fluid and the contaminants from scattering away.

The fluid discharging apparatus 20 may include a swing arm 23, a swing arm support column 21, a pair of connecting tubes 25, and a pair of fluid discharging nozzles 30.

The swing arm support column 21 extends upward from a point spaced apart from the table 11.

The swing arm 23 has one end rotatably coupled to the swing arm support column 21 and the other end configured to fix and support the pair of connecting tubes 25. The swing arm 23 pivotally rotates clockwise and counterclockwise about an arm axis AS extending in the longitudinal direction of the swing arm support column 21. In FIG. 1, a swing arm rotation driver configured to rotate the swing arm 23 about the arm axis AS is omitted.

The pair of connecting tubes 25 each have one end fixed and supported by the other end of the swing arm 23 and the other end configured to fix and support the pair of fluid discharging nozzles 30.

When the pair of fluid discharging nozzles 30 are positioned on the substrate 1 due to the swing arm 23 swinging about the arm axis AS, a treatment fluid transferred through an inner flow path, which extends inside the swing arm support column 21 and the swing arm 23, passes through the pair of connecting tubes 25 and is discharged to fall onto the substrate 1 through the pair of fluid discharging nozzles 30.

The pair of fluid discharging nozzles 30 may be connected one-to-one to the pair of connecting tubes 25 and may be disposed adjacent to each other at the same height. When the swing arm 23 swings about the arm axis AS, the pair of fluid discharging nozzles 30 move together in the horizontal direction along a circular trajectory. Also, when the swing arm support column 21 moves upward or downward along the arm axis S, the pair of fluid discharging nozzles 30 move together in the vertical direction.

Each of the fluid discharging nozzles 30 includes a nozzle cap 35 which is fastened and fixed to the other end of the connecting tube 25, a nozzle tube 31 whose lower end passes through the nozzle cap 35 and protrudes downward, and a sealing material 33 which is installed between an inner side surface of the nozzle cap 35 and an outer side surface of the nozzle tube 31.

The nozzle tube 31 has an inner diameter less than an inner diameter of the connecting tube 25 and is disposed at the other end of the connecting tube 25. The sealing material 33 seals the inside of the nozzle cap 35 to prevent the treatment fluid from leaking through a lower end opening of the nozzle cap 35 that is formed to allow the nozzle tube 31 to pass therethrough.

Although the substrate treatment apparatus 10 including the pair of connecting tubes 25 and the pair of fluid discharging nozzles 30 is disclosed in FIGS. 1 and 2, the number of connecting tubes 25 and the number of fluid discharging nozzles 30 may each be one or be more than two.

The fluid discharging nozzle cleaning apparatus 40 is an apparatus for cleaning the pair of fluid discharging nozzles 30 of the fluid discharging apparatus 20 and may include a cup 41, a cleaning liquid discharger 50, a drying gas discharger 70, and a gas exhauster 85.

The cup 41 is a hopper-shaped member in which an inner space 44 is formed. The cup 41 is positioned at a point to which the pair of fluid discharging nozzles 30 return after an end of a task in which the pair of fluid discharging nozzles 30 discharge the treatment fluid to the substrate 1 and treat the substrate 1, that is, a home position.

An upper opening 45 which is open to allow the pair of fluid discharging nozzles 30 to enter the inner space 44 is formed on an upper side of the cup 41, and a lower opening 48 through which a cleaning liquid is discharged from the inner space 44 to the outside is formed on a lower side of the cup 41. The cleaning liquid and contaminants discharged through the lower opening 48 may be drained after undergoing a purification process.

The cleaning liquid discharger 50 discharges the cleaning liquid to the pair of fluid discharging nozzles 30 when the pair of fluid discharging nozzles 30 are positioned in the inner space 44 of the cup 41. For example, the cleaning liquid may be deionized water.

The cleaning liquid discharger 50 may include an annular flow path portion 51, a connecting flow path portion 55, a connector 57, a cleaning liquid supply tube 60, a cleaning liquid tank 63, a cleaning liquid supply pump 61, and a valve 62.

The annular flow path portion 51 surrounds a sidewall 42 of the cup 41 and is coupled to the sidewall 42. An annular flow path 52 along which the cleaning liquid flows is formed inside the annular flow path portion 51. A plurality of cleaning liquid nozzle portions 54 configured to discharge the cleaning liquid introduced into the annular flow path 52 toward the pair of fluid discharging nozzles 30 positioned in the inner space 44 are provided in the sidewall 42.

Each of the cleaning liquid nozzle portions 54 may be configured to include a discharge through-hole that passes through the sidewall 42 or may be configured to include a nozzle installed in the sidewall 42 so that the cleaning liquid is discharged by passing through the sidewall 42. For example, the size of an inner diameter of an end of the cleaning liquid nozzle portion 54 through which the cleaning liquid is discharged may be 1 mm.

The connecting flow path portion 55 protrudes in a radial direction from one side of the annular flow path portion 51, and a connecting flow path 56 fluidly connected to the annular flow path 52 is formed in the connecting flow path portion 55.

The cleaning liquid tank 63 is a tank accommodating the cleaning liquid and is provided outside the cup 41. The cleaning liquid supply tube 60 guides the cleaning liquid so that the cleaning liquid is supplied from the cleaning liquid tank 63 to the connecting flow path 56.

One end of cleaning liquid supply tube 60 is fluidly connected to the cleaning liquid tank 63, and the other end of the cleaning liquid supply tube 60 is fluidly connected to the connecting flow path 56 via the connector 57.

The cleaning liquid supply pump 61 presses the cleaning liquid so that the cleaning liquid is discharged inward from the sidewall 42 between the upper opening 45 and the lower opening 48 through the plurality of cleaning liquid nozzle portions 54 via the cleaning liquid supply tube 60, the connecting flow path 56, and the annular flow path 52 from the cleaning liquid tank 63. The valve 62 selectively causes the cleaning liquid to flow or stops the flow of the cleaning liquid.

After discharging the treatment fluid and treating the substrate 1, the pair of fluid discharging nozzles 30 horizontally move and return to the home position so as to be aligned with the upper opening 45 of the cup 41 and move downward so as to enter the inner space 44 through the upper opening 45. Then, the cleaning liquid discharger 50 discharges the cleaning liquid to the plurality of fluid discharging nozzles 30 positioned in the inner space 44 simultaneously through the plurality of cleaning liquid nozzle portions 54.

The plurality of cleaning liquid nozzle portions 54 horizontally discharge the cleaning liquid toward lower ends of a pair of nozzle tubes 31.

Specifically, the number of the plurality of cleaning liquid nozzle portions 54 is eight. Among the eight cleaning liquid nozzle portions 54, four cleaning liquid nozzle portions 54 are disposed at 90° intervals about the center of the cup 41. Among the four cleaning liquid nozzle portions 54, a pair of cleaning liquid nozzle portions 54 spaced apart at a 180° interval discharge the cleaning liquid to side surfaces of the lower ends of the pair of nozzle tubes 31 that oppose each other to clean the side surfaces opposing each other.

The cleaning liquid discharged from the other pair of cleaning liquid nozzle portions 54 spaced apart at a 180° interval among the four cleaning liquid nozzle portions 54 collides and scatters between the pair of fluid discharging nozzles 30 and cleans side surfaces of the lower ends of the pair of nozzle tubes 31 that face each other.

The other four of the plurality of cleaning liquid nozzle portions 54 discharge the cleaning liquid to left side surfaces and right side surfaces of the lower ends of the pair of nozzle tubes 31 to clean the left side surfaces and the right side surfaces of the lower ends of the pair of nozzle tubes 31. Accordingly, the outer side surfaces of the pair of fluid discharging nozzles 30 are thoroughly cleaned by the cleaning liquid.

The cleaning liquid may be discharged with a flow rate in a range of 0.3 to 3.0 L/min (liter/minute) to the inner space 44 of the cup 41 through the plurality of cleaning liquid nozzle portions 54.

When the flow rate of the cleaning liquid is lower than 0.3 L/min, a discharge pressure of the cleaning liquid is too low such that the cleaning liquid does not reach the pair of fluid discharging nozzles 30 or is not able to remove contaminants attached to surfaces of the pair of fluid discharging nozzles 30.

On the other hand, when the flow rate of the cleaning liquid is higher than 3.0 L/min, the discharge pressure of the cleaning liquid is too high such that the pair of fluid discharging nozzles 30 are damaged, or the cleaning liquid colliding with the surfaces of the pair of fluid discharging nozzles 30 scatters to the outside of the cup 41 through the upper opening 45 of the cup 41.

Also, an amount of time during which the cleaning liquid is discharged may be in a range of 10 seconds to 2 minutes. When the amount of time during which the cleaning liquid is discharged is less than 10 seconds, the pair of fluid discharging nozzles 30 may not be thoroughly cleaned. Conversely, when the amount of time during which the cleaning liquid is discharged exceeds 2 minutes, the total amount of time taken for a task of discharging a treatment fluid to a plurality of substrates 1 and treating the plurality of substrates 1 may be too large. This is because the task of cleaning the fluid discharging nozzles 30 is performed every time a single substrate 1 is mounted on the table 11 and treated.

The drying gas discharger 70 discharges a drying gas for drying the pair of fluid discharging nozzles 30 after the discharge of the cleaning liquid by the cleaning liquid discharger 50 ends. For example, the drying gas may be a pure nitrogen gas ($N_2$) from which moisture is removed.

The drying gas discharger 70 may include an annular flow path portion 71, a connecting flow path portion 75, a connector 77, a drying gas supply tube 80, a drying gas tank 83, a drying gas supply pump 81, and a valve 82.

Like the annular flow path portion 51 of the cleaning liquid discharger 50, the annular flow path portion 71 of the drying gas discharger 70 surrounds the sidewall 42 of the cup 41 and is coupled to the sidewall 42. An annular flow path 72 along which the drying gas flows is formed inside the annular flow path portion 71. A plurality of drying gas nozzle portions 74 configured to discharge the drying gas introduced into the annular flow path 72 toward the pair of fluid discharging nozzles 30 positioned in the inner space 44 are provided in the sidewall 42.

Each of the drying gas nozzle portions 74 may be configured to include a discharge through-hole that passes through the sidewall 42 or may be configured to include a nozzle installed in the sidewall 42 so that the drying gas is discharged by passing through the sidewall 42. For example, the size of an inner diameter of an end of the drying gas nozzle portion 74 through which the drying gas is discharged may be 1 mm.

The connecting flow path portion 75 protrudes in a radial direction from one side of the annular flow path portion 71, and a connecting flow path (not illustrated) fluidly connected to the annular flow path 72 is formed in the connecting flow path portion 75. The drying gas tank 83 is a tank accommodating the drying gas and is provided outside the cup 41. The drying gas supply tube 80 guides the drying gas so that the drying gas is supplied from the drying gas tank 83 to the connecting flow path of the connecting flow path portion 75.

One end of drying gas supply tube 80 is fluidly connected to the drying gas tank 83, and the other end of the drying gas supply tube 80 is fluidly connected to the connecting flow path of the connecting flow path portion 75 via the connector 77.

The drying gas supply pump 81 presses the drying gas so that the drying gas is discharged inward from the sidewall 42 between the upper opening 45 and the lower opening 48 through the plurality of drying gas nozzle portions 74 via the drying gas supply tube 80, the connecting flow path of the connecting flow path portion 75, and the annular flow path 72 from the drying gas tank 83. The valve 82 selectively causes the drying gas to flow or stops the flow of the drying gas.

The drying gas is simultaneously discharged to the pair of fluid discharging nozzles 30 after the discharge of the cleaning liquid by the cleaning liquid discharger 50 ends. The drying gas discharger 70 discharges the drying gas toward an inside of the cup 41 from a point on the sidewall 42 of the cup 41 that is higher than a point from which the cleaning liquid is discharged. In more detail, the annular flow path portion 71 of the drying gas discharger 70 is positioned higher than the annular flow path portion 51 of the cleaning liquid discharger 50, and the plurality of drying gas nozzle portions 74 are provided at points higher than points where the plurality of cleaning liquid nozzle portions 54 are positioned.

A height of a point toward which the drying gas discharged through the plurality of drying gas nozzle portions 74 by the drying gas discharger 70 heads is higher than a height of a point toward which the cleaning liquid discharged through the plurality of cleaning liquid nozzle portions 54 by the cleaning liquid discharger 50 heads. In more detail, the plurality of drying gas nozzle portions 74 discharge the drying gas in a direction inclined downward toward points on the surfaces of the fluid discharging nozzles 30 that are higher than the lower ends of the pair of nozzle tubes 31 and lower than upper ends of a pair of nozzle caps 35.

Specifically, the number of the plurality of drying gas nozzle portions 74 is eight. As in the case of the eight cleaning liquid nozzle portions 54, four of the eight drying gas nozzle portions 74 are disposed at 90° intervals about the center of the cup 41.

Among the four drying gas nozzle portions 74, a pair of drying gas nozzle portions 74 spaced apart at a 180° interval discharge the drying gas to side surfaces of the pair of fluid discharging nozzles 30 that oppose each other to remove the cleaning liquid remaining on the side surfaces opposing each other and dry the side surfaces.

The drying gas discharged from the other pair of drying gas nozzle portions 74 spaced apart at a 180° interval among the four drying gas nozzle portions 74 collides between the pair of fluid discharging nozzles 30, diffuses to surroundings, and removes the cleaning liquid remaining on side surfaces of the pair of fluid discharging nozzles 30 that face each other and dries the side surfaces.

The other four of the plurality of drying gas nozzle portions 74 discharge the drying gas to left side surfaces and right side surfaces of the pair of fluid discharging nozzles 30 to remove the cleaning liquid remaining on the left side surfaces and the right side surfaces of the pair of fluid discharging nozzles 30 and dry the side surfaces. Since the drying gas is discharged in the direction inclined downward from the plurality of drying gas nozzle portions 74, a cross-sectional area of the discharged drying gas gradually increases away from the plurality of drying gas nozzle portions 74, and the drying gas reaches the outer side surfaces of the pair of fluid discharging nozzles 30, and thus, a wide area of the outer side surfaces of the pair of fluid discharging nozzles 30 is dried from top to bottom. As a result, the outer side surfaces of the pair of fluid discharging nozzles 30 are thoroughly dried by the drying gas.

A discharge angle of the drying gas discharged from each of the drying gas nozzle portions 74 is defined as an angle between the horizontal plane and a virtual line of inclination that extends in a direction in which the drying gas is discharged. A discharge angle A1 of the drying gas discharged toward the side surfaces of the pair of fluid discharging nozzles 30 that oppose each other is larger than a discharge angle A2 of the drying gas discharged toward the left side surfaces and the right side surfaces of the pair of fluid discharging nozzles 30. For example, the discharge angle A1 may be in a range of 45° to 55°, and the discharge angle A2 may be in a range of 30° to 40°.

The drying gas may be discharged with a flow rate in a range of 30 to 100 L/min to the inner space 44 of the cup 41 through the plurality of drying gas nozzle portions 74.

When the flow rate of the drying gas is lower than 30 L/min, a discharge pressure of the drying gas is too low such that the drying gas does not reach the pair of fluid discharging nozzles 30 or is not able to dry the surfaces of the pair of fluid discharging nozzles 30.

On the other hand, when the flow rate of the drying gas is higher than 100 L/min, the discharge pressure of the drying gas is too high such that the pair of fluid discharging nozzles 30 are damaged, or the drying gas colliding with the surfaces of the pair of fluid discharging nozzles 30 diffuses to the outside of the cup 41 through the upper opening 45 of the cup 41.

Also, an amount of time during which the drying gas is discharged may be in a range of 30 seconds to 5 minutes. When the amount of time during which the drying gas is discharged is less than 30 seconds, the surfaces of the pair of fluid discharging nozzles 30 may not be thoroughly dried. Conversely, when the amount of time during which the drying gas is discharged exceeds 5 minutes, the total amount of time taken for a task of discharging the treatment fluid to the plurality of substrates 1 and treating the plurality of substrates 1 may be too large.

To prevent a gas accumulated in the inner space 44 of the cup 41 from being discharged to the outside of the cup 41 through the upper opening 45 while the cleaning liquid discharger 50 and the drying gas discharger 70 operate, the gas exhauster 85 suctions the gas from the inner space 44 of the cup 41 and discharges the suctioned gas to the outside of the cup 41.

The gas includes a steam, which is formed due to evaporation of the cleaning liquid, and the drying gas. The gas exhauster 85 may start operating when, or a few seconds before, the cleaning liquid discharger 50 operates and begins to discharge the cleaning liquid and may end operating when, or a few seconds after, the discharge of the drying gas by the drying gas discharger 70 ends.

The gas exhauster 85 includes an annular flow path portion 86, a connecting flow path portion 90, a connector 92, an exhaust tube 94, a purifying filter 96, and an exhaust pump 95.

Like the annular flow path portions 51 and 71 of the cleaning liquid discharger 50 and the drying gas discharger 70, the annular flow path portion 86 of the gas exhauster 85 surrounds the sidewall 42 of the cup 41 and is coupled to the sidewall 42. An annular flow path 87 along which the suctioned gas flows is formed inside the annular flow path portion 86. The annular flow path portion 86 of the gas exhauster 85 is disposed above the annular flow path portion 71 of the drying gas discharger 70.

A suction port 88 is formed in the annular flow path portion 86 to allow the gas to be suctioned and move along the annular flow path 87 inside the cup 41. Also, a nozzle entry/exit through-hole 89 which is open to prevent the upper opening 45 of the cup 41 from being closed and the entry/exit of the pair of fluid discharging nozzles 30 from being blocked is formed in the annular flow path portion 86.

The connecting flow path portion 90 protrudes in a radial direction from one side of the annular flow path portion 86, and a connecting flow path (not illustrated) fluidly connected to the annular flow path 87 is formed in the connecting flow path portion 90. The exhaust pump 95 forms a negative pressure in the annular flow path 87 to allow the gas to be suctioned through the suction port 88 and is provided outside the cup 41.

One end of exhaust tube 94 is fluidly connected to the exhaust pump 95, and the other end of the exhaust tube 94 is fluidly connected to the connecting flow path of the connecting flow path portion 90 via the connector 92. The purifying filter 96 filters contaminants from the gas which is introduced through the suction port 88 and moves toward the exhaust pump 95 through the exhaust tube 94. The gas from which the contaminants are filtered through the purifying filter 96 is discharged to the outside through the exhaust pump 95.

A method for cleaning the fluid discharging nozzle 30 using the fluid discharging nozzle cleaning apparatus 40 includes a nozzle positioning operation, a cleaning liquid discharging operation, and a drying operation. The nozzle positioning operation is an operation in which, to allow the fluid discharging nozzle 30 to be positioned in the inner space 44 of the cup 41, the fluid discharging nozzle 30 is caused to enter the inner space 44 of the cup 41 through the upper opening 45. Prior to the nozzle positioning operation, a treatment fluid discharging operation in which a treatment fluid id discharged to the substrate 1 through the fluid discharging nozzle 30 to treat the substrate 1 is performed. Also, the nozzle positioning operation includes, after an end of the treatment fluid discharging operation, an operation in which the fluid discharging nozzle 30 is returned to a point at which the fluid discharging nozzle 30 is vertically aligned with the upper opening 45, that is, the home position.

The cleaning liquid discharging operation is an operation in which the cleaning liquid is discharged to clean the fluid discharging nozzle 30. The cleaning liquid discharging operation is performed by the cleaning liquid discharger 50, and since the cleaning liquid discharging operation has been described in detail above in describing the cleaning liquid discharger 50 with reference to FIGS. 1 to 4, repeated description thereof will be omitted.

The drying operation is an operation in which, after the cleaning liquid discharging operation ends, the drying gas is discharged to dry the surface of the fluid discharging nozzle 30. The drying operation is performed by the drying gas discharger 70, and since the drying operation has been described in detail above in describing the drying gas discharger 70 with reference to FIGS. 1 to 4, repeated description thereof will be omitted.

The method for cleaning the fluid discharging nozzle 30 may further include a gas exhausting operation in which, to prevent the gas accumulated in the inner space 44 of the cup 41 from being discharged to the outside of the cup 41 through the upper opening 45 while the cleaning liquid discharging operation and the drying operation are performed, the gas is suctioned from the inner space 44 of the cup 41 and discharged to the outside of the cup 41. The gas exhausting operation is performed by the gas exhauster 85, and since the gas exhausting operation has been described in detail above in describing the gas exhauster 85 with reference to FIGS. 1 to 4, repeated description thereof will be omitted.

Between a start time point of the nozzle positioning operation and an end time point of the drying operation, a substrate replacing operation in which the substrate 1 treated with the discharged treatment fluid is replaced with a new substrate 1 to which the treatment fluid has not been discharged is performed. In more detail, after the fluid discharging nozzle 30 returns to the home position, the treated substrate 1 is unloaded from the table 11, and a new substrate 1 on which the substrate treatment has not been performed is loaded on the table 11. In this case, the method for cleaning the fluid discharging nozzle 30 may not start the cleaning liquid discharging operation before a removal of the treated substrate 1 from the table 11 is detected.

Figure 5:
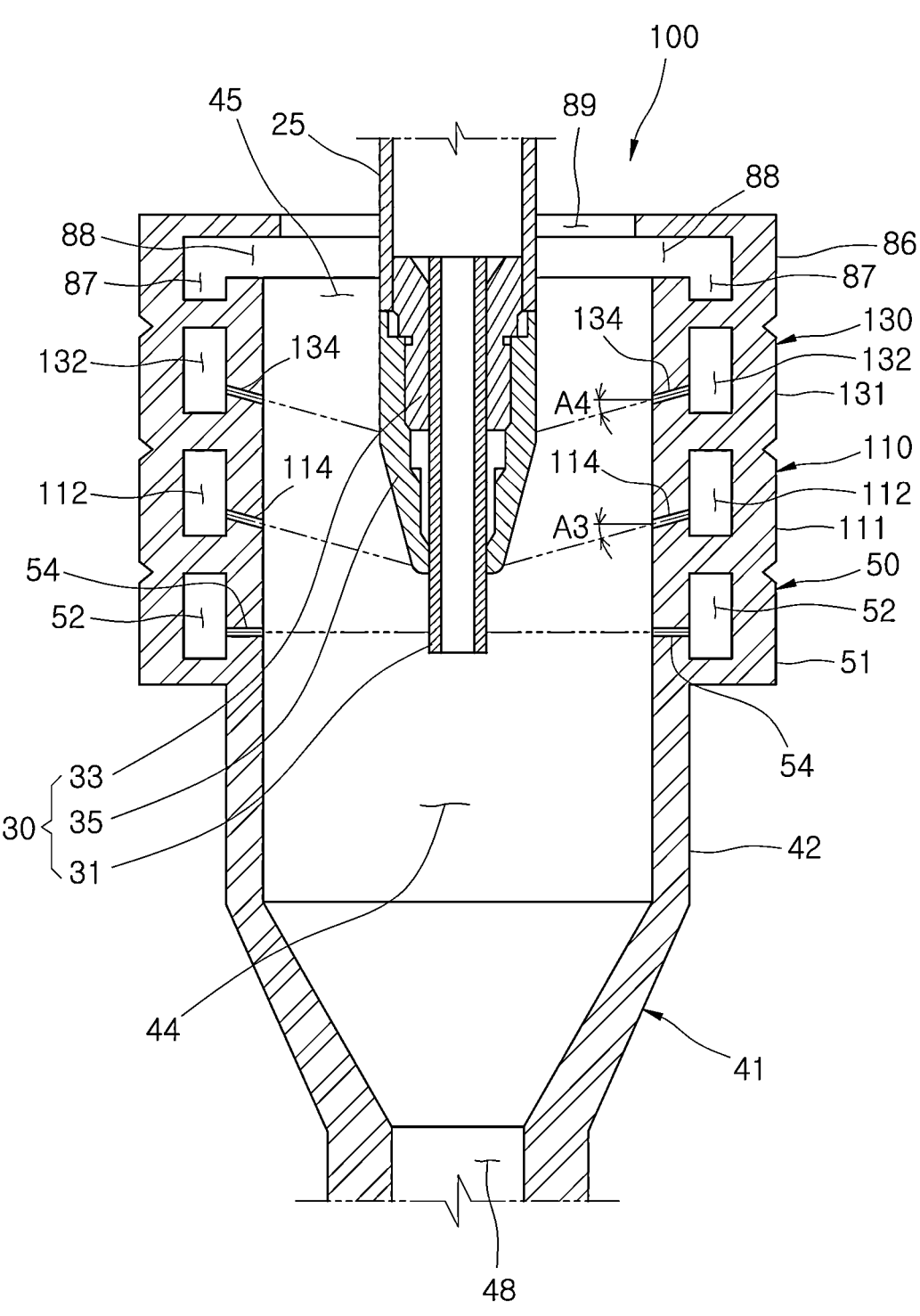
FIG. 5 is a longitudinal cross-sectional view of a fluid discharging nozzle cleaning apparatus according to a second embodiment of the present disclosure.

FIG. 5 is a longitudinal cross-sectional view of a fluid discharging nozzle cleaning apparatus according to a second embodiment of the present disclosure. A fluid discharging nozzle cleaning apparatus 100 according to the second embodiment of the present disclosure illustrated in FIG. 5 may replace the fluid discharging nozzle cleaning apparatus 40 according to the first embodiment of the present disclosure and may be provided in the substrate treatment apparatus 10 of FIG. 1. Among elements denoted by reference numerals in FIG. 5, the elements denoted by the same reference numerals as the elements included in the fluid discharging nozzle cleaning apparatus 40 illustrated in FIGS. 1 to 4 are the elements identical thereto, and repeated descriptions thereof may be omitted below.

Referring to FIG. 5, the fluid discharging nozzle cleaning apparatus 100 according to the second embodiment of the present disclosure is an apparatus for cleaning the fluid discharging nozzle 30 and includes a cup 41, a cleaning liquid discharger 50, a first drying gas discharger 110, a second drying gas discharger 130, and a gas exhauster 85. The fluid discharging nozzle 30 which is fixed to and supported by the other end of the connecting tube 25 is the same as the fluid discharging nozzles 30 illustrated in FIGS. 1 to 4 except that the fluid discharging nozzle 30 is provided as a single fluid discharging nozzle 30 instead of being provided as a pair, and thus repeated description thereof will be omitted. The cup 41 and the gas exhauster 85 are also the same as the cup 41 and the gas exhauster 85 included in the fluid discharging nozzle cleaning apparatus 40 according to the first embodiment of the present disclosure, and thus repeated descriptions thereof will be omitted.

Except that the number of cleaning liquid nozzle portions 54 may be different from the number of cleaning liquid nozzle portions 54 illustrated in FIGS. 1 to 4 due to the fluid discharging nozzle 30 being provided as a single fluid discharging nozzle 30, the configuration of the cleaning liquid discharger 50 illustrated in FIG. 5 is also the same as the configuration of the cleaning liquid discharger 50 included in the fluid discharging nozzle cleaning apparatus 40 according to the first embodiment of the present disclosure, and thus repeated description thereof will be omitted.

The first drying gas discharger 110 and the second drying gas discharger 130 discharge a drying gas for drying the fluid discharging nozzle 30 after the discharge of the cleaning liquid by the cleaning liquid discharger 50 ends. The first drying gas discharger 110 and the second drying gas discharger 130 include annular flow path portions 111 and 131, respectively, and each include a connecting flow path portion (not illustrated), a drying gas supply tube (not illustrated), a drying gas tank (not illustrated), a drying gas supply pump (not illustrated), and a valve (not illustrated).

Like the annular flow path portion 51 of the cleaning liquid discharger 50, the annular flow path portions 111 and 131 of the drying gas dischargers 110 and 130 surround the sidewall 42 of the cup 41 and are coupled to the sidewall 42. Annular flow paths 112 and 132 along which the drying gas flows are formed inside the annular flow path portions 111 and 131, respectively. A plurality of drying gas nozzle portions 114 and 134 configured to discharge the drying gas introduced into the annular flow paths 112 and 132 toward the fluid discharging nozzle 30 positioned in the inner space 44 are provided in the sidewall 42. Each of the drying gas nozzle portions 114 and 134 may be configured to include a discharge through-hole that passes through the sidewall 42 or may be configured to include a nozzle installed in the sidewall 42 so that the drying gas is discharged by passing through the sidewall 42.

A connecting flow path fluidly connected to the annular flow path 112 and a connecting flow path fluidly connected to the annular flow path 132 are formed in the connecting flow path portion of the first drying gas discharger 110 and the connecting flow path portion of the second drying gas discharger 130, respectively. The drying gas tank is a tank accommodating the drying gas and is provided outside the cup 41. The drying gas supply tube guides the drying gas so that the drying gas is supplied from the drying gas tank to the connecting flow path of the connecting flow path portion.

One end of drying gas supply tube is fluidly connected to the drying gas tank, and the other end of the drying gas supply tube is fluidly connected to the connecting flow path of the connecting flow path portion. The drying gas supply pump presses the drying gas so that the drying gas is discharged inward from the sidewall 42 between the upper opening 45 and the lower opening 48 through the plurality of drying gas nozzle portions 114 and 134 via the drying gas supply tube, the connecting flow path of the connecting flow path portion, and the annular flow paths 112 and 132 from the drying gas tank. The valve selectively causes the drying gas to flow or stops the flow of the drying gas.

The drying gas is discharged to the fluid discharging nozzle 30 simultaneously through the plurality of drying gas nozzle portions 114 and 134 by the first drying gas discharger 110 and the second drying gas discharger 130 after the discharge of the cleaning liquid by the cleaning liquid discharger 50 ends. Since the first drying gas discharger 110 and the second drying gas discharger 130 simultaneously start operating and simultaneously end operating, the first drying gas discharger 110 and the second drying gas discharger 130 may, instead of each including the drying gas tank (not illustrated), the drying gas supply pump (not illustrated), and the valve (not illustrated), share a single drying gas tank (not illustrated), a single drying gas supply pump (not illustrated), and a single valve (not illustrated). In this case, the drying gas supply tube may include a single inflow path and a pair of outflow paths branched from the single inflow path, the single inflow path may be connected to the drying gas tank, and the pair of outflow paths may be connected to each of the connecting flow paths of the first drying gas discharger 110 and the second drying gas discharger 130.

The first drying gas discharger 110 discharges the drying gas toward the inside of the cup 41 from a point on the sidewall 42 of the cup 41 that is higher than a point from which the cleaning liquid is discharged. Also, the second drying gas discharger 130 discharges the drying gas toward the inside of the cup 41 from a point higher than the point from which the drying gas is discharged by the first drying gas discharger 110. In more detail, the annular flow path portion 111 of the first drying gas discharger 110 is positioned higher than the annular flow path portion 51 of the cleaning liquid discharger 50, and the plurality of drying gas nozzle portions 114 of the first drying gas discharger 110 are provided at points higher than points where the plurality of cleaning liquid nozzle portions 54 are positioned. Also, the annular flow path portion 131 of the second drying gas discharger 130 is positioned higher than the annular flow path portion 111 of the first drying gas discharger 110, and the plurality of drying gas nozzle portions 134 of the second drying gas discharger 130 are provided at points higher than the points where the plurality of drying gas nozzle portions 114 of the first drying gas discharger 110 are positioned.

Due to the second drying gas discharger 130 positioned at a relatively higher point among the pair of drying gas dischargers 110 and 130, a height of a point toward which the drying gas discharged through the plurality of drying gas nozzle portions 134 by the second drying gas discharger 130 heads is higher than a height of a point toward which the drying gas discharged through the plurality of drying gas nozzle portions 114 by the first drying gas discharger 110 heads. In more detail, the plurality of drying gas nozzle portions 114 of the first drying gas discharger 110 discharge the drying gas in a direction inclined downward toward a lower end of a nozzle cap 35, and the plurality of drying gas nozzle portions 134 of the second drying gas discharger 130 discharge the drying gas in a direction inclined downward toward an intermediate point higher than the lower end of the nozzle cap 35. Due to such a configuration, an outer side surface of the fluid discharging nozzle 30 is thoroughly dried by the drying gas, and in particular, an upper end of the nozzle cap 35 and an end of the connecting tube 25 coupled thereto are also thoroughly dried.

A discharge angle of the drying gas discharged from the drying gas nozzle portions 114 and 134 is defined as an angle between the horizontal plane and a virtual line of inclination that extends in a direction in which the drying gas is discharged. For example, a discharge angle A3 of the drying gas discharged through the drying gas nozzle portions 114 of the first drying gas discharger 110 and a discharge angle A4 of the drying gas discharged through the drying gas nozzle portions 134 of the second drying gas discharger 130 may be equal to each other and may be in a range of 20° to 30°.

Figure 6:
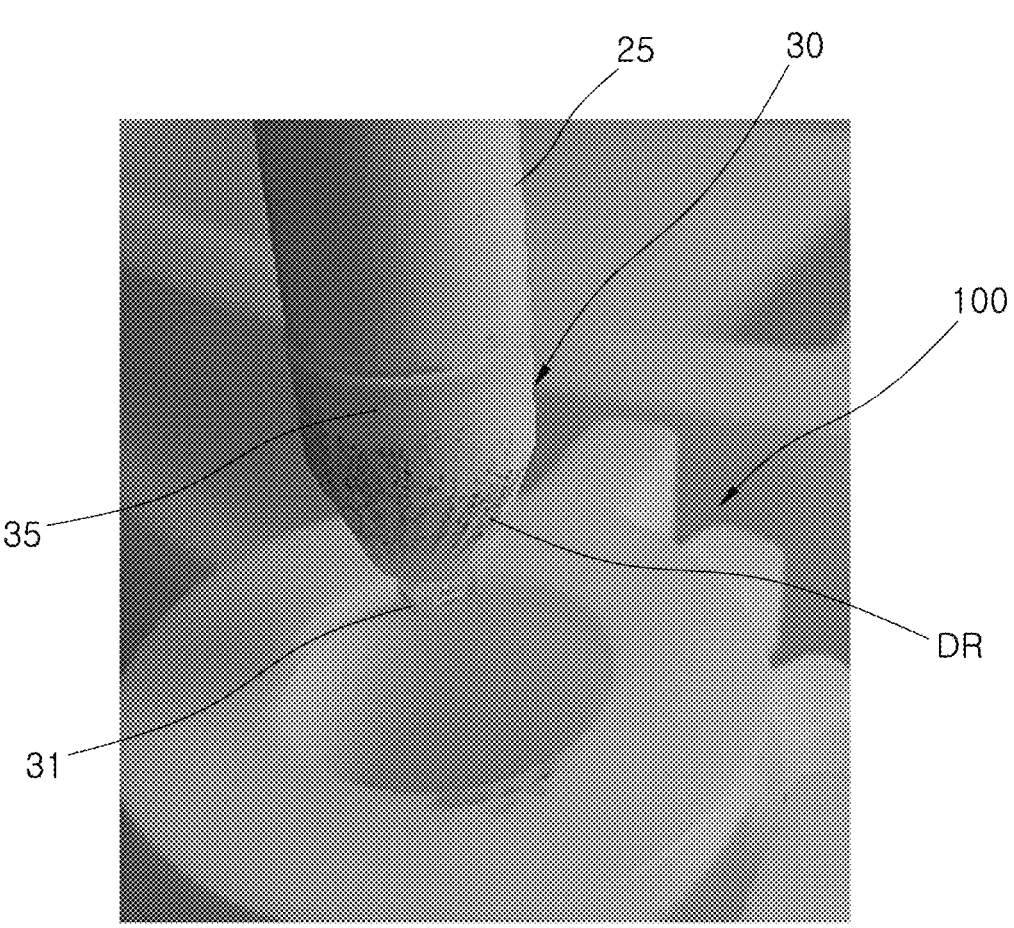
FIG. 6 is a before picture for verifying effects of the fluid discharging nozzle cleaning apparatus of the present disclosure and shows a state before the fluid discharging nozzle is cleaned.
Figure 7:
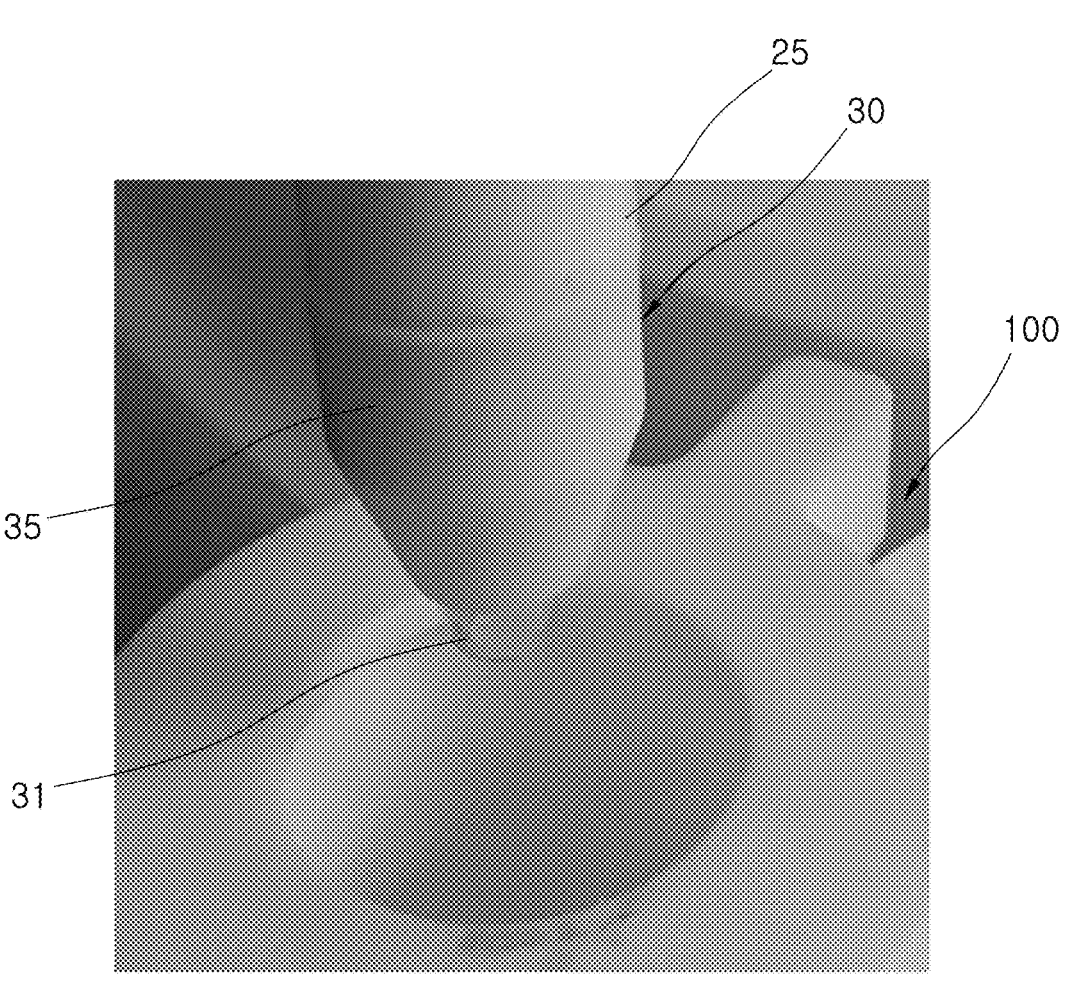
FIG. 7 is an after picture for verifying the effects of the fluid discharging nozzle cleaning apparatus of the present disclosure and shows a state after the fluid discharging nozzle is cleaned.

FIG. 6 is a before picture for verifying effects of the fluid discharging nozzle cleaning apparatus of the present disclosure and shows a state before the fluid discharging nozzle is cleaned, and FIG. 7 is an after picture for verifying the effects of the fluid discharging nozzle cleaning apparatus of the present disclosure and shows a state after the fluid discharging nozzle is cleaned.

Referring to FIGS. 5 and 6, a fluid discharging nozzle 30 in which a surface of the nozzle cap 35 is, for example, colored with crayons or the like and stained with contaminants DR is prepared. The fluid discharging nozzle 30 stained with the contaminants is moved to a position at which the fluid discharging nozzle 30 is vertically aligned with the cup 41 of the fluid discharging nozzle cleaning apparatus 100 according to the second embodiment of the present disclosure.

The fluid discharging nozzle 30 enters the inner space 44 of the cup 41 through the upper opening 45, the cleaning liquid is discharged by the cleaning liquid discharger 50, and the drying gas is discharged by the first drying gas discharger 110 and the second drying gas discharger 130. In this way, the cleaning of the fluid discharging nozzle 30 ends. As illustrated in FIG. 7, the fluid discharging nozzle 30 lifted to exit the inner space 44 of the cup 41 after the end of cleaning is in a thoroughly cleaned state in which the contaminants DR do not remain on the surface of the nozzle cap 35 and is in a thoroughly dried state in which traces of the cleaning liquid do not remain either. In the experimental example shown in the pictures, the cleaning liquid is deionized water, the drying gas is a nitrogen gas from which moisture is removed, a flow rate with which the cleaning liquid is discharged and the amount of time during which the cleaning liquid is discharged are 1 L/min and 1 minute, respectively, and a flow rate with which the drying gas is discharged and the amount of time during which the drying gas is discharged are 50 L/min and 3 minutes, respectively.

According to the present disclosure, since a fluid discharging nozzle is cleaned after a treatment fluid is discharged, fume is not released from an end of the fluid discharging nozzle, and a process chamber or a substrate is prevented from being contaminated due to the treatment fluid or contaminants remaining on the fluid discharging nozzle.

According to the present disclosure, since the fluid discharging nozzle can be designed to be cleaned of contaminants by a cleaning liquid discharged to the fluid discharging nozzle simultaneously from a plurality of points around the fluid discharging nozzle, insufficient cleaning of some parts of the fluid discharging nozzle can be prevented, and even in a case in which the fluid discharging nozzle is provided as a plurality of fluid discharging nozzles, the plurality of fluid discharging nozzles can be thoroughly cleaned without any insufficiently cleaned parts.

According to the present disclosure, the cleaning liquid is discharged toward an end of a nozzle tube, and a drying gas is discharged toward a point higher than a discharge target point of the cleaning liquid while being discharged to be inclined downward from around the fluid discharging nozzle. Thus, a flow rate of the drying gas and an amount of time during which the drying gas is discharged that are necessary for the cleaning liquid to completely dry and be removed from a surface of the fluid discharging nozzle are reduced, and as a result, the time and cost for the task of cleaning the fluid discharging nozzle are reduced.

The present disclosure has been described above with reference to the embodiments illustrated in the drawings, but the description is merely illustrative, and those of ordinary skill in the art should understand that various modifications and other equivalent embodiments are possible therefrom. Therefore, the true protection scope of the present disclosure should be defined only by the appended claims.

What is claimed is:

1. A fluid discharging nozzle cleaning apparatus comprising:

a cup having an upper opening which is open to allow a fluid discharging nozzle to enter an inner space and a lower opening through which a cleaning liquid is discharged from the inner space to an outside;

a cleaning liquid discharger configured to discharge the cleaning liquid to the fluid discharging nozzle in a state in which the fluid discharging nozzle is positioned in the inner space of the cup; and a drying gas discharger configured to discharge a drying gas for drying the fluid discharging nozzle after the discharge of the cleaning liquid ends, wherein the drying gas discharger includes one or more nozzle portions formed in a sidewall of the cup, the nozzle portions of the drying gas discharger being angled inward towards a central axis of the cup and downward towards a bottom of the cup; and a gas exhauster configured to prevent a gas accumulated in the inner space of the cup from being discharged through the upper opening while the cleaning liquid discharger and the drying gas discharger operate, by suctioning the gas from the inner space of the cup and discharging the suctioned gas to the outside of the cup, wherein the gas exhauster comprises a purifying filter configured to filter contaminants from the gas.

2. The fluid discharging nozzle cleaning apparatus of claim 1, wherein:

the cleaning liquid discharger discharges the cleaning liquid inward from the sidewall of the cup between the upper opening and the lower opening of the cup; and the drying gas discharger discharges the drying gas inward from a point on the sidewall of the cup that is higher than a point from which the cleaning liquid is discharged.

3. The fluid discharging nozzle cleaning apparatus of claim 2, wherein the cleaning liquid discharger includes:

an annular flow path portion configured to surround the cup and be coupled to the cup;

a connecting flow path portion configured to protrude in a radial direction from the annular flow path portion and be fluidly connected through an inside thereof to the annular flow path portion;

a cleaning liquid supply tube having one side fluidly connected to a cleaning liquid tank and the other side fluidly connected to the connecting flow path portion; and a cleaning liquid supply pump configured to press the cleaning liquid so that the cleaning liquid is discharged from the cleaning liquid tank toward an inside of the cup.

4. The fluid discharging nozzle cleaning apparatus of claim 2, wherein:

the drying gas discharger is provided as a plurality of drying gas dischargers; and a height of a point toward which a drying gas discharged by the drying gas discharger positioned at a high point among the plurality of drying gas dischargers heads is higher than a height of a point toward which a drying gas discharged by the drying gas discharger positioned at a low point heads.

5. The fluid discharging nozzle cleaning apparatus of claim 4, wherein the drying gas discharger includes:

an annular flow path portion which is configured to surround the cup and be coupled to the cup and has an annular flow path, through which the drying gas is able to flow, provided therein;

a connecting flow path portion configured to protrude in a radial direction from the annular flow path portion and be fluidly connected to the annular flow path;

a drying gas supply tube having one side fluidly connected to a drying gas tank and the other side fluidly connected to the connecting flow path portion; and a drying gas supply pump configured to press the drying gas so that the drying gas is discharged from the drying gas tank toward an inside of the cup.

6. The fluid discharging nozzle cleaning apparatus of claim 1, wherein:

the fluid discharging nozzle is provided as a plurality of fluid discharging nozzles;

the plurality of fluid discharging nozzles are disposed adjacent to each other and move together in horizontal and vertical directions;

the cleaning liquid discharger simultaneously discharges the cleaning liquid to the plurality of fluid discharging nozzles positioned in the inner space of the cup; and the drying gas discharger simultaneously discharges the drying gas to the plurality of fluid discharging nozzles after the discharge of the cleaning liquid ends.

7. The fluid discharging nozzle cleaning apparatus of claim 1, wherein:

the cleaning liquid discharger discharges the cleaning liquid with a flow rate in a range of 0.3 to 3.0 L/min (liter/minute) to the inner space of the cup; and an amount of time during which the cleaning liquid is discharged is in a range of 10 seconds to 2 minutes.

8. The fluid discharging nozzle cleaning apparatus of claim 1, wherein:

the drying gas discharger discharges the drying gas with a flow rate in a range of 30 to 100 L/min (liter/minute) to the inner space of the cup; and an amount of time during which the drying gas is discharged is in a range of 30 seconds to 5 minutes.

9. The fluid discharging nozzle cleaning apparatus of claim 1, wherein:

the cleaning liquid is deionized water; and the drying gas is a nitrogen gas ($N_2$).

10. The fluid discharging nozzle cleaning apparatus of claim 1, wherein the gas exhauster includes:

an annular flow path portion configured to surround the cup and be coupled to the cup;

a connecting flow path portion configured to protrude in a radial direction from the annular flow path portion and be fluidly connected to the annular flow path portion; and an exhaust tube having one side fluidly connected to an exhaust pump and the other side fluidly connected to the connecting flow path portion.

11. The fluid discharging nozzle cleaning apparatus of claim 1, wherein a plurality of nozzle portions are provided, and when an angle formed by the nozzle portions of the drying gas discharger with respect to the bottom of the cup is defined as a discharge angle, the nozzle portions of the drying gas discharger discharge at two discharge angles.

12. A method for cleaning a fluid discharging nozzle, the method comprising:

a nozzle positioning operation in which, to allow the fluid discharging nozzle to be positioned in an inner space of a cup, the fluid discharging nozzle is caused to enter the inner space of the cup through an upper opening of the cup;

a cleaning liquid discharging operation in which a cleaning liquid is discharged to clean the fluid discharging nozzle;

a drying operation in which, after the cleaning liquid discharging operation ends, a drying gas is discharged to dry a surface of the fluid discharging nozzle, wherein the drying gas is discharged through one or more nozzle portions of a drying gas discharger formed in a sidewall of the cup, the nozzle portions of the drying gas discharger and the gas discharging through the nozzle portions of the drying gas discharger are inward towards a central axis of the cup and downward towards a bottom of the cup; and a gas exhausting operation in which, to prevent a gas accumulated in the inner space of the cup from being discharged to an outside of the cup through the upper opening while the cleaning liquid discharging operation and the drying operation are performed, the gas is suctioned from the inner space of the cup and discharged to the outside of the cup, wherein the gas exhausting operation comprises a gas purifying operation in which contaminants in the suctioned gas are filtered by a purifying filter of a gas exhauster.

13. The method of claim 12, wherein:

the cup is positioned at a point to which the fluid discharging nozzle returns after an end of a task in which the fluid discharging nozzle discharges a fluid to a substrate to treat the substrate; and between a start time point of the nozzle positioning operation and an end time point of the drying operation, the substrate treated with the discharged fluid is replaced with a substrate to which the fluid has not been discharged.

14. The method of claim 12, further comprising, prior to the nozzle positioning operation, a treatment fluid discharging operation in which a treatment fluid is discharged to a substrate through the fluid discharging nozzle to treat the substrate.

15. The method of claim 12, wherein a plurality of nozzle portions are provided, and when an angle formed by the nozzle portions of the drying gas discharger with respect to the bottom of the cup is defined as a discharge angle, the nozzle portions of the drying gas discharger discharge at two discharge angles.

* * * * *